United States Patent
Hardy et al.

(10) Patent No.: US 7,036,198 B2
(45) Date of Patent: May 2, 2006

(54) METHOD OF ASSEMBLING AN ACTUATOR ARRANGEMENT

(75) Inventors: Martin Paul Hardy, Gillingham (GB); Andrew John Hargreaves, Faversham (GB); Michael Peter Cooke, Gillingham (GB)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/470,815

(22) PCT Filed: Jan. 29, 2002

(86) PCT No.: PCT/GB02/00377

§ 371 (c)(1),
(2), (4) Date: Jan. 5, 2004

(87) PCT Pub. No.: WO02/061856

PCT Pub. Date: Aug. 8, 2002

(65) Prior Publication Data

US 2004/0113525 A1    Jun. 17, 2004

(30) Foreign Application Priority Data

Feb. 1, 2001  (GB)  .................... 0102500

(51) Int. Cl.
*H04R 17/00*  (2006.01)
*H01L 41/04*  (2006.01)
*H01L 41/08*  (2006.01)
*H01L 41/18*  (2006.01)
*H02N 2/00*  (2006.01)

(52) U.S. Cl. .......................... 29/25.35; 29/830; 29/837; 29/841; 29/852; 29/869; 29/873; 29/888; 310/328

(58) Field of Classification Search ............. 29/25.35, 29/830, 837, 841, 852, 869, 873, 888; 310/328, 310/323, 338, 341; 264/72.11, 72.15, 102, 264/279

See application file for complete search history.

(56) References Cited

U.S. PATENT DOCUMENTS

| | | | | |
|---|---|---|---|---|
| 4,553,059 A | * | 11/1985 | Abe et al. ..................... | 310/328 |
| 4,821,726 A | * | 4/1989 | Tamura et al. ............... | 123/498 |
| 4,941,612 A | * | 7/1990 | Li ................................ | 239/88 |
| 5,143,291 A | * | 9/1992 | Grinsteiner .................. | 239/88 |
| 5,143,301 A | * | 9/1992 | Reiter et al. ............. | 239/585.4 |
| 5,188,073 A | * | 2/1993 | Ejiri et al. ............. | 123/339.28 |
| 5,915,626 A | * | 6/1999 | Awarzamani et al. ....... | 239/135 |

* cited by examiner

*Primary Examiner*—A. Dexter Tugbang
*Assistant Examiner*—Tai Van Nguyen
(74) *Attorney, Agent, or Firm*—David P. Wood

(57) ABSTRACT

A method of assembling a piezoelectric actuator arrangement comprises providing a piezoelectric element having first and second ends and arranging the piezoelectric element within a sleeve member such that the inner surface of the sleeve member defines, together with the outer surface of the piezoelectric element, a chamber for receiving a first filler material. The first filler material is injected into the chamber and a heating effect is applied to the sleeve member such that the sleeve member deforms to seal against the first filler material. The invention also relates to a piezoelectric actuator arrangement arranged within a sleeve member, an inner surface of the sleeve member and an outer surface of the piezoelectric element together defining, at least in part, a chamber containing a filler material such that, when the actuator arrangement is in use, a force due to fuel pressure within an injector accumulator volume is applied to the piezoelectric element through the sleeve member and the filler material.

14 Claims, 3 Drawing Sheets

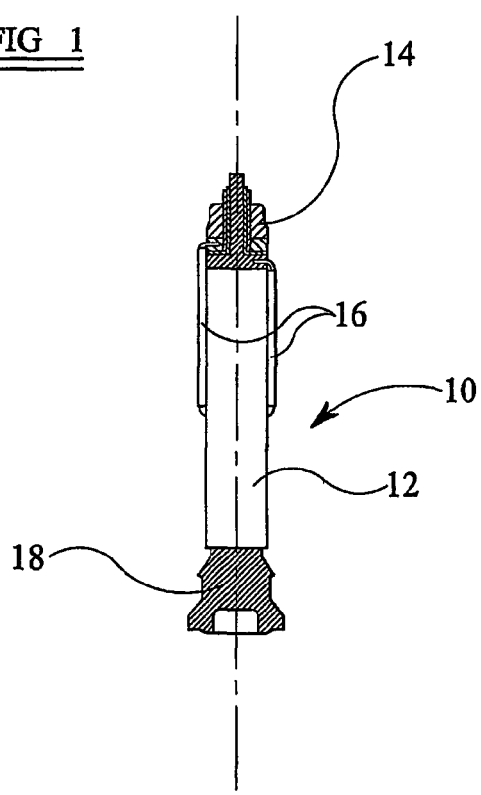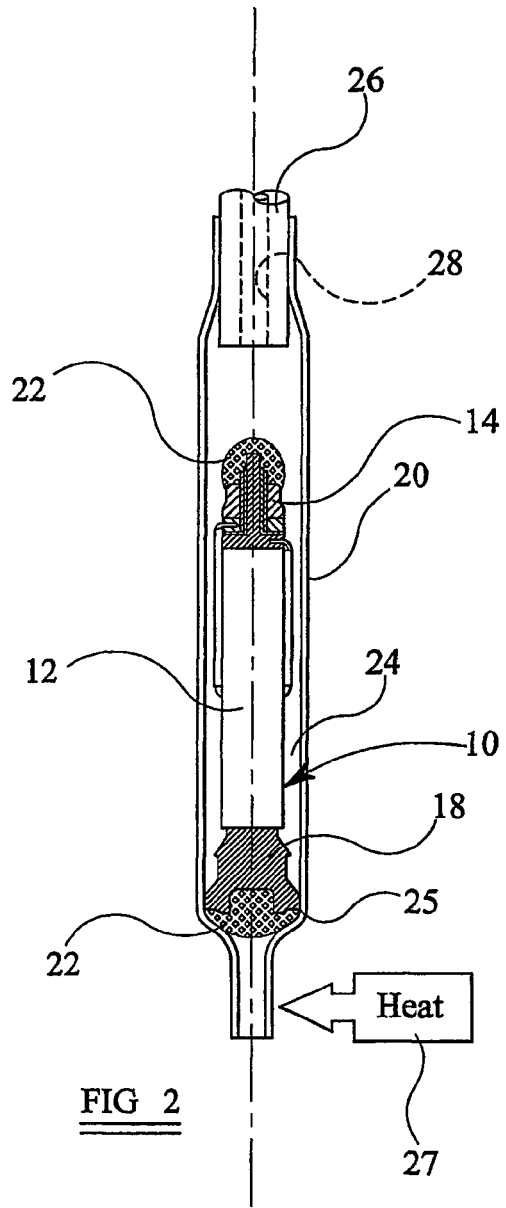

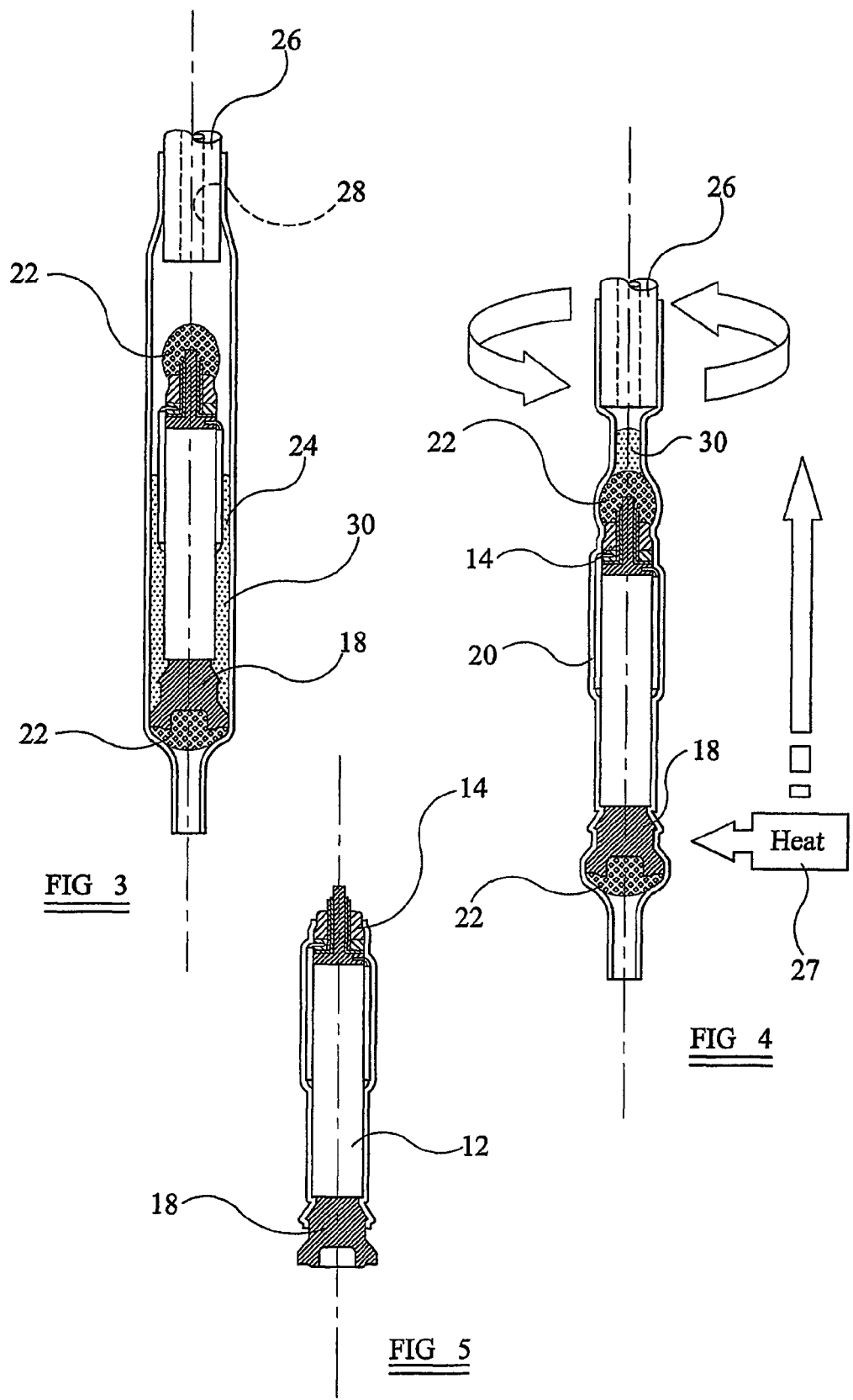

METHOD OF ASSEMBLING AN ACTUATOR ARRANGEMENT

FIELD OF THE INVENTION

This invention relates to a method of assembling an actuator arrangement for use in a fuel injector of the type intended for use in a fuel system of an internal combustion engine. The invention also relates to an actuator arrangement for use in a fuel injector of the type intended for use in a fuel system of an internal combustion engine.

BACKGROUND OF THE INVENTION

In a known piezoelectrically actuated fuel injector, a piezoelectric actuator arrangement is operable to control the position occupied by a control piston, the piston being moveable to control the fuel pressure within a control chamber defined, in part, by a surface associated with the valve needle of the injector to control movement of the injector. The piezoelectric actuator typically includes a stack of piezoelectric elements, the axial length of which is controlled by applying a voltage across the stack through an electrical connector. It is known to arrange the piezoelectric stack within an accumulator volume which is arranged to receive high pressure fuel, in use, so as to apply a hydrostatic load to the stack.

It is important to ensure that the piezoelectric stack and the associated electrical connections are sealed from high pressure fuel within the accumulator volume. For this purpose, it is known to use a plastic over-moulding technique to encapsulate the piezoelectric actuator arrangement within a plastic casing. However, it is also important to ensure that any sealing arrangement which is provided does not significantly increase the size of the actuator arrangement as the accommodation space available for the actuator within the injector is limited. Known over-moulding techniques result in the encapsulated actuator arrangement having a relatively large size.

It is also known to hermetically seal the piezoelectric actuator arrangement within a metal walled container. However this process involves the use of a laser-welding technique to seal a closure plate on the container once the actuator arrangement has been inserted. The method of assembly is therefore a relatively time consuming and costly process. Additionally, when assembled, the actuator arrangement is a relatively large unit, whereas it is an advantage for the unit to be compact.

It is an object of the present invention to provide a method of assembling a piezoelectric actuator arrangement which alleviates this problem.

According to the present invention, a method of assembling a piezoelectric actuator arrangement comprises the steps of:

providing a piezoelectric element having first and second ends;

arranging the piezoelectric element within a sleeve member such that the inner surface of the sleeve member and the outer surface of the piezoelectric element together define, at least in part, a chamber for receiving a first filler material;

injecting the first filler material into the chamber; and applying a heating effect to the sleeve member to deform the sleeve member; and sealing the sleeve member against the first filler material.

The present invention provides an advantage over conventional plastic over-moulding and metal-encapsulation techniques in that manufacturing costs are reduced. Additionally, an encapsulated actuator arrangement of reduced size can be formed.

Preferably, the method comprises the step of degassing the first filler material following injection thereof into the chamber so as to substantially remove any unwanted air or gas from the first filler material.

The method may comprise the further step of injecting a second filler material into the sleeve member prior to injection of the first filler material so as to fill any recesses or pockets within the sleeve member with the second filler material, which may otherwise trap air during injection of the first filler material, wherein the second filler material has a relatively high viscosity compared to the viscosity of the first filler material. For example, the first filler material may have a viscosity in the range between 400 and 800 mPas and the second filler material may have a viscosity in the range between 5,000 and 10,000 mPas.

Typically, at least one of the first and second filler materials may take the form of a curable resin. Typically, the sleeve member is formed from a fluoropolymer or plastic material.

The method preferably includes the further steps of arranging a shaft in the sleeve member such that angular movement of the shaft causes angular movement of the sleeve member and the piezoelectric element, providing means for applying a heating effect to the sleeve member and angularly moving the shaft such that the heating effect is applied substantially uniformly to the circumferential surface of the sleeve member.

The method may include the further step of moving the shaft in an axial direction as the shaft is moved angularly, so as to ensure a substantially uniform heating effect is applied to the circumferential surface of the sleeve member along its entire axial length.

If the shaft is hollow, the first filler material may be injected into the chamber through the hollow shaft. Alternatively, the sleeve member may be provided with an aperture through which the first filler material is injected into the chamber.

The method preferably comprises the further step of securing electrical connection means or an electrical connection arrangement, for applying a voltage across the piezoelectric element in use, to the first end of the piezoelectric element.

The method may comprise the further step of securing an end member to the second end of the piezoelectric element and applying protective means or a protective arrangement to at least one of the electrical connection means and the end member so as to avoid contamination of the end member and/or the electrical connection means by the first filler material.

Preferably, the protective means may take the form of protective members or plugs formed from a flexible material so as to facilitate ease of removal of the protective means from the end member and/or the electrical connection means.

The piezoelectric actuator arrangement may include a plurality of piezoelectric elements arranged in a stack, or may include a single piezoelectric element.

According to a second aspect of the present invention, a piezoelectric actuator arrangement for use in a fuel injector comprising an accumulator volume for receiving fuel, in use, comprises a piezoelectric element which is arranged within a sleeve member, an inner surface of the sleeve member and an outer surface of the piezoelectric element together defining, at least in part, a chamber containing a filler material such that, when the actuator arrangement is in use, a force due to fuel pressure within the accumulator volume is applied to the piezoelectric element through the sleeve member and the filler material.

Preferably, the sleeve is formed from a heat-shrinkable material which deforms to form a seal against the first filler material upon application of heat thereto during assembly of the arrangement.

BRIEF DESCRIPTION OF THE DRAWINGS

Other advantages of the present invention will be readily appreciated as the same becomes better understood by reference to the following detailed description when considered in connection with the accompanying drawings wherein:

The invention will now be described, by way of example only, with reference to the accompanying FIGS. 1 to 5 which illustrate the steps of a method for assembling a piezoelectric actuator arrangement, and with reference to FIG. 6 which illustrates an alternative step in the method of the present invention.

DETAILED DESCRIPTION OF THE INVENTION

Figure 6:
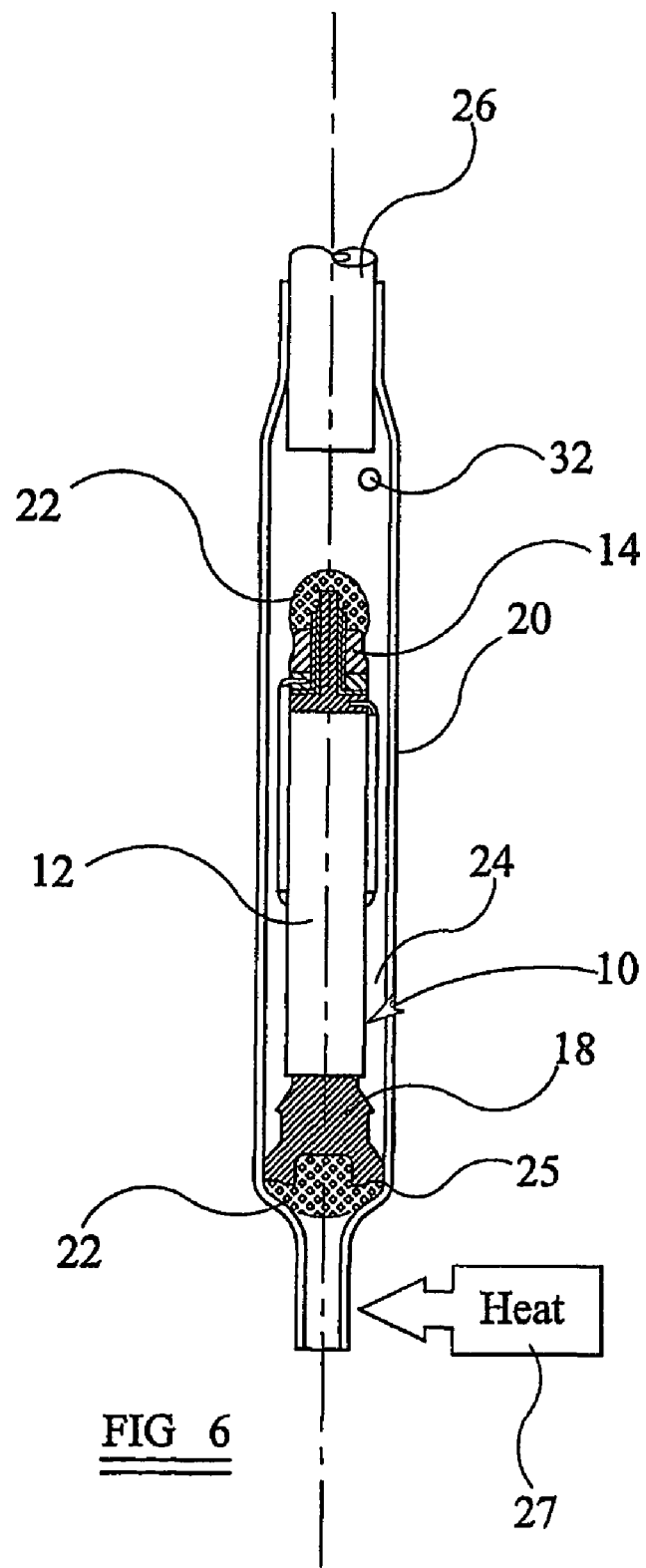

Obviously, many modifications and variations of the present invention are possible in light of the above teachings. The invention may be practiced otherwise than as specifically described within the scope of the appended claims.

Referring to FIG. 1, an actuator arrangement, referred to generally as 10, comprises a stack 12 of piezoelectric elements. The actuator arrangement is of the type suitable for use in a fuel injector for delivering fuel to an engine cylinder of an internal combustion engine. A first end of the piezoelectric stack 12 is secured to an electrical connector 14 to which electrical wires 16 are connected so as to apply a voltage across the piezoelectric stack 12 when the injector is in use. A second end of the piezoelectric stack is in connection with an end member 18 which is co-operable, in use, with a piston member (not shown) associated with a valve needle of the injector. By controlling the voltage applied across the piezoelectric stack 12, the energisation level and, hence, the axial length of the stack 12 can be varied. Upon a reduction in the axial length of the piezoelectric stack 12, the end member 18 is caused to move so as to apply a retracting force to the control piston associated with the valve needle.

Typically, the control piston is arranged to control fuel pressure within a control chamber. The pressure of fuel within the control chamber applies a force to the valve needle which determines whether the valve needle is seated against a valve seating, in which case fuel injection does not occur, or whether the valve needle is lifted away from its seating, in which case fuel injection does occur.

Alternatively, the end member 18 associated with the piezoelectric stack 12 may be coupled directly to the valve needle of the injector, or may be coupled to a servo-valve arrangement in a known manner.

In order to assemble the fuel injector, the pre-assembled actuator arrangement 10 shown in FIG. 1 is arranged within an accumulator volume (not shown) defined within an injector housing. In use, the accumulator volume receives fuel at high pressure such that a hydrostatic load is applied to the piezoelectric stack 12. It is important that the electrical connections of the actuator arrangement and the stack are substantially sealed from fuel within the accumulator volume. To achieve this, the actuator arrangement is therefore assembled by performing the following steps.

Initially, the actuator arrangement 10 is inserted into one end of a sleeve member 20, as shown in FIG. 2. Protective means, typically in the form of one or more protective members or plugs 22, are applied to the exposed end surfaces of the end member 18 and the electrical connector 14. At the end of the sleeve member 20 remote from the end member 18, a rotatable shaft 26 is inserted into the sleeve member 20. The outer surface of the piezoelectric stack 12 and the inner surface of the sleeve member 20 together define a chamber 24.

A heating effect is applied to the end of the sleeve member 20 adjacent the end member 18 such that the sleeve member 20 deforms to form a seal 25 with an outer surface of the end member 18 by means of a 'heat shrinking' process. The heating effect may be applied by any heat source 27 which is sufficient to provide an adequate heating effect to deform the sleeve member 20 to seal against the end member 18. A heating effect is also applied to the end of the sleeve member adjacent the shaft 26 such that the sleeve member 20 deforms to seal against the shaft 26. Typically, the sleeve member 20 may be formed from a fluoropolymer or plastic material which deforms when a heating effect is applied thereto.

As illustrated in FIG. 3, the shaft 26 is provided with a through bore 28 through which a filler material 30 is delivered to the chamber 24. The prospective members 22 are arranged to ensure that the exposed end surfaces of the end member 18 and the electrical connector 14 are not contaminated by filler material 30 as it is injected into the chamber 24. The filler material 30 may take the form of a curable epoxy resin having a relatively low viscosity. Typically, the viscosity of the filler material 30 is in the range between 400–800 mPas. The filler material provides good adhesion between the sleeve member 20 and the actuator arrangement 10 and also ensures a substantially uniform distribution of the hydrostatic load from fuel with the accumulator volume is applied to the actuator arrangement 10, through the sleeve member 20 and the filler material 30, when the injector is in use. The filler material 30 also ensures the actuator arrangement is sealed against the ingress of fuel from the accumulator volume.

Once the filler material 30 is introduced into the chamber 24, a degassing process is applied to the filler material 30 so as to substantially remove any unwanted air within the filler material 30. For example, the degassing process may be provided by means of a heat treatment followed by the application of a vacuum. Conveniently, a vacuum may be drawn in the material-filled chamber by means of the through bore 28 provided in the shaft 26.

As illustrated in FIG. 4, once the filler material 30 has been degassed, the shaft 26 is moved angularly about its axis, thereby causing angular movement of the sleeve member 20 and the actuator arrangement 10. Additionally, the heat source 27 is moved axially along the length of the sleeve member 20 such that a substantially uniform heating effect is applied to the outer surface of the sleeve member 20. The application of heat to the sleeve member 20 causes the sleeve member 20 to deform by means of a 'heat shrinking' process, thereby causing the sleeve member 20 to adopt the profile of the outer surface of the actuator arrangement 10. As the sleeve member 20 deforms, some of the filler material 30 within the chamber 24 will extrude through a narrow clearance defined by the deforming inner surface of the sleeve member 20 and the piezoelectric stack 12 and/or between a narrow clearance defined by the deforming inner surface of the sleeve member 20 and the electrical connector 14 (as illustrated in FIG. 4).

If the filler material 30 takes the form of a curable epoxy resin, the resin is allowed to cure before the shaft 26 is removed from the uppermost end of the sleeve member 20. The extreme ends of the sleeve member 20 are cut to the required length and the protective plugs 22 are removed from the end member and the electrical connector, leaving the actuator arrangement 10 substantially encapsulated within the sleeve member 20, as illustrated in FIG. 5. Preferably, the protective members 22 are formed from a flexible material to facilitate ease of removal.

In a preferred embodiment of the invention, prior to the injection of a relatively low viscosity filler material 30 into the chamber 24 (as illustrated in FIG. 3), a second filler material, having a relatively high viscosity, may be introduced into the sleeve member 20 to fill any unavoidable recesses or pockets within the arrangement which may otherwise trap air during the filling process. If the second filler material is introduced, it is preferable to ensure that this material is allowed to cure sufficiently before the sleeve member 20 is heat shrunk to form a seal 25 with the end member 18. Typically, the second filler material of relatively high viscosity may also take the form of a curable resin. The second filler material conveniently has a viscosity in the range between 5,000 and 10,000 mPas.

Once the actuator arrangement 10 is encapsulated within the sleeve member 20 (as illustrated in FIG. 5), the actuator arrangement can be introduced into the fuel injector in a conventional manner, the actuator arrangement being arranged such that the outer surface of the sleeve member 20 is exposed to fuel pressure within the accumulator volume of the injector when the injector is in use.

The filler material 30 need not take the form of an epoxy resin, but may take the form of any relatively low viscosity material which is sufficient to ensure there is a substantially uniform distribution of the hydrostatic load on the piezoelectric stack 12 when the accumulator volume is filled with fuel at high pressure. For example, the filler material may take the form of a polyurethane resin. The filler material must also provide good adhesion between the sleeve member 20 and the piezoelectric stack 12 and must have electrically insulating properties. The filler material must also be sufficient to ensure the encapsulated actuator arrangement assembly is substantially impermeable to the ingress of fuel under high pressure within the accumulator volume. In applications in which the hydrostatic load applied to the actuator arrangement is by means of water, as opposed to fuel, the filler material may be formed from silicone rubber.

A suitable material for the sleeve member 20 is a radiation cross-linked modified fluoropolymer. It will be appreciated, however, that other suitable heat shrinkable materials may be used. It is important that the materials from which the sleeve 20 and the filler material 30 are formed have chemical properties which resist chemical damage caused by fuel within the accumulator volume.

In an alternative embodiment of the invention, the sleeve member 20 may be provided with an opening or aperture 32, as shown in FIG. 6, to permit the filler material 30 to be injected into the chamber 24. It will be appreciated that, if the aperture 32 is provided, the shaft 26 need not be provided with the through bore 28.

As an alternative to providing the shaft 26, once the actuator arrangement 10 is arranged within the sleeve member 20, the assembly may remain stationary whilst a heat source is translated circumferentially and axially relative to the sleeve member 20. Alternatively, a heat source of annular form may be translated along the axial length of the sleeve member 20 so as to cause deformation of the sleeve member 20. In any of the embodiments of the invention, it is preferable for the heat source 27 and/or the shaft 26 to be moved relatively slowly such that any pockets of air within the filler material 30 are able to rise to the surface thereof.

It will be appreciated that the provision of the shaft 26 is not essential, and an alternative means for moving the sleeve member 20 may be provided, if required.

In a further alternative embodiment, the filler material 30 may be delivered to the chamber 24 through a length of flexible plastic tubing, one end of which extends into the chamber 24 and the other end of which remains submerged within a reservoir of filler material 30 during delivery of the filler material 30. By delivering the filler material 30 to the chamber 24 through a submerged tube, the risk of any gas or air becoming trapped within the filler material 30 during delivery is minimized.

If the degassing progress is sufficient to ensure substantially all air pockets within the filler material 30 are removed prior to heat shrinking of the sleeve member 20, the heating effect may be applied to the sleeve member 20 by placing the arrangement in an oven.

It will be appreciated that the piezoelectric actuator arrangement 10 need not include a stack of elements, but may include a single piezoelectric element.

The present invention provides the advantage that the encapsulated actuator arrangement is relatively compact. In fuel injector applications, where the available accommodation space for the actuator arrangement is limited, this provides a particular advantage. Furthermore, the encapsulation of the actuator arrangement within the sleeve 20 filled with filler material 30 ensures the entire assembly is substantially impermeable to fuel under high pressure which may otherwise contaminate the actuator arrangement. The invention therefore minimizes the risk of an electrical failure occurring within the injector, in use. However, it will be appreciated that the actuator arrangement assembled in accordance with the present invention may also be employed in alternative applications, and need not necessarily be installed in a fuel injector for use in an internal combustion engine.

The present invention provides a further advantage over metal-encapsulation techniques in that manufacturing costs are reduced.

What is claimed is:

1. A method of assembling a piezoelectric actuator arrangement comprising:

providing a piezoelectric element having first and second ends;

arranging the piezoelectric element within a sleeve member such that the inner surface of the sleeve member and the outer surface of the piezoelectric element together define, at least in part, a chamber for receiving a first filler material;

injecting the first filler material into the chamber;

applying a heating effect to the sleeve member to deform the sleeve member; and sealing the sleeve member against the first filler material, further comprising degassing the first filler material following injection thereof into the chamber so as to substantially remove any unwanted air or gas from the first filler material and injecting a second filler material into the sleeve member prior to injection of the first filler material so as to fill any recesses or pockets within the sleeve member with the second filler material which may otherwise trap air or gas during injection of the first filler material, wherein the second filler material has a relatively high viscosity compared to the viscosity of the first filler material.

2. A method of assembling a piezoelectric actuator arrangement comprising:
providing a piezoelectric element having first and second ends;
arranging the piezoelectric element within a sleeve member such that the inner surface of the sleeve member and the outer surface of the piezoelectric element together define, at least in part, a chamber for receiving a first filler material;
injecting the first filler material into the chamber;
applying a heating effect to the sleeve member to deform the sleeve member; and
sealing the sleeve member against the first filler material;
wherein one or more of the first and second filler materials takes the form of a curable resin.

3. A method as claimed in claim 2, wherein the sleeve member is formed from a fluoropolymer.

4. A method as claimed in claim 2, further comprising securing an electrical connection arrangement for applying a voltage across the piezoelectric element, in use, to the first end of the piezoelectric element.

5. A method as claimed in claim 1, wherein the piezoelectric actuator arrangement comprises a plurality of piezoelectric elements arranged in a stack.

6. A method of assembling a piezoelectric actuator arrangement comprising:
providing a piezoelectric element having first and second ends;
arranging the piezoelectric element within a sleeve member such that the inner surface of the sleeve member and the outer surface of the piezoelectric element together define at least in part, a chamber for receiving a first filler material;
injecting the first filler material into the chamber;
applying a heating effect to the sleeve member to deform the sleeve member; and
sealing the sleeve member against the first filler material;
arranging a shaft in the sleeve member such that angular movement of the shaft causes angular movement of the sleeve member and the piezoelectric element;
providing a heating arrangement for applying a heating effect to the sleeve member, and
angularly moving the shaft such that the heating effect is applied substantially uniformly to the circumferential surface of the sleeve member.

7. A method as claimed in claim 6, comprising moving the shaft in an axial direction as the shaft is moved angularly, so as to ensure a substantially uniform heating effect is applied to the circumferential surface of the sleeve member along its full axial length.

8. A method as claimed in claim 7, wherein the shaft is hollow, the first filler material being injected into the chamber through the hollow shaft.

9. A method as claimed in claim 7, wherein the sleeve member is provided with an aperture through which the first filler material is injected into the chamber.

10. A method as claimed in claim 6, wherein the shaft is hollow, the first filler material being injected into the chamber through the hollow shaft.

11. A method as claimed in claim 6, wherein the sleeve member is provided with an aperture through which the first filler material is injected into the chamber.

12. A method of assembling a piezoelectric actuator arrangement comprising:
providing a piezoelectric element having first and second ends;
arranging the piezoelectric element within a sleeve member such that the inner surface of the sleeve member and the outer surface of the piezoelectric element together define, at least in part, a chamber for receiving a first filler material;
injecting the first filler material into the chamber;
applying a hearing effect to the sleeve member to deform the sleeve member;
sealing the sleeve member against the first filler material;
securing an electrical connection arrangement for applying a voltage across the piezoelectric element, in use, to the first end of the piezoelectric element;
securing an end member to the second end of the piezoelectric element; and
applying a protective arrangement to at least one of the electrical connection arrangement and the end member so as to avoid contamination of the end member and/or the electrical connection arrangement by the first filler material;
wherein one or more of the first and second filler materials takes the form of a curable resin.

13. A method as claimed in claim 12, wherein the protective arrangement is formed from a flexible material so as to facilitate ease of removal of the protective arrangement from the end member and/or the electrical connection arrangement.

14. A method as claimed in claim 13, wherein the protective arrangement takes the form of protective plugs.

* * * * *